United States Patent [19]

Hattori et al.

[11] Patent Number: 5,244,873
[45] Date of Patent: Sep. 14, 1993

[54] PROCESS FOR PREPARING A THIN FILM OF BI-TYPE OXIDE SUPERCONDUCTOR

[75] Inventors: Hisao Hattori; Kenjiro Higaki; Hideo Itozaki, all of Hyogo, Japan

[73] Assignee: Sumitomo Electric Industries, Ltd., Osaka, Japan

[21] Appl. No.: 795,797

[22] Filed: Nov. 21, 1991

[30] Foreign Application Priority Data

Nov. 21, 1990 [JP] Japan ................. 2-316748

[51] Int. Cl.$^5$ ................. H01L 39/24; C23C 14/35
[52] U.S. Cl. ................. 505/1; 204/192.24; 505/731; 505/782
[58] Field of Search ............. 204/192.24; 505/1, 731, 505/782

[56] References Cited

U.S. PATENT DOCUMENTS 4,963,524 10/1990 Yamazaki ................. 505/1
5,032,571 7/1991 Takemura ................. 505/1

FOREIGN PATENT DOCUMENTS

WO89/11736 11/1989 PCT Int'l Appl. ............ 204/192.24

Primary Examiner—Aaron Weisstuch
Attorney, Agent, or Firm—Kerkam, Stowell, Kondracki & Clarke

[57] ABSTRACT

A process for preparing a single crystal thin film made of oxide superconductor of Bi, Sr, Ca, and Cu on a substrate by a sputtering method using a target made of a sintered oxide of Bi, Sr, Ca, and Cu and having its c-axis oriented in parallel with the surface of the substrate.

The sputtering is effected by 90° off-axis magnetron sputtering at a substrate temperature between 500° C. and 750° C. at a gas pressure between 0.001 Torr and 1 Torr.

4 Claims, 1 Drawing Sheet

PROCESS FOR PREPARING A THIN FILM OF BI-TYPE OXIDE SUPERCONDUCTOR

BACKGROUND OF THE INVENTION

1. Field of the Invention

The present invention relates to a process for preparing a thin film of Bi-type oxide superconductor, more particularly to a process for depositing a single crystal thin film of Bi-type oxide superconductor whose c-axis is oriented in parallel with a surface of a substrate.

2. Description of the Related Art

Oxide superconductors of the Bi-Sr-Ca-Cu-0 system (hereinafter, Bi-type oxide superconductors) possess higher critical temperatures than those of the Y-Ba-Cu-0 system and hence are expected to have many practical applications.

In the meantime, it is indispensable to prepare thin films of such oxide superconductors in order to actually utilize them in electronic devices such as Josephson devices and superconducting transistors. Today, it is possible to prepare a thin film of single crystal of an oxide superconductor of the Y-Ba-Cu-O system by a variety of techniques including sputtering, vacuum evaporation, laser abeation, or the like.

However, in the case of Bi-type oxide superconductors, it is difficult or impossible to prepare a single crystal thin film having a well-ordered crystalline structure for several reasons; in particular, because more than two phases, each having a different superconducting property, are produced simultaneously.

It is known that the Bi-type oxide superconductors show anisotropy in their superconducting properties. In fact, their crystals show higher critical current density (Jc) along a direction which is perpendicular to the c-axis than along the other directions. In many superconducting devices, at least one additional layer is deposited on the thin film of Bi-type oxide superconductor. In such devices, the thin film of Bi-type oxide superconductor is required to have a crystal orientation wherein the c-axis of the thin film is oriented in parallel with the surface of the substrate in order to obtain higher critical current flow in a direction (depth-wise direction) which is perpendicular to the surface of the substrate.

However, the c-axis of thin films of Bi-type oxide superconductors prepared by known techniques is oriented perpendicularly to the surface of the substrate. In other words, it is difficult to prepare a single crystal thin film of Bi-type oxide superconductor whose c-axis is oriented in parallel with the surface of substrate, so that thin films of Bi-type oxide superconductor prepared by known techniques have not been utilized advantageously in superconducting electronic devices.

Furthermore, thin films of Bi-type oxide superconductors prepared by known techniques do not have a smooth surface and show relatively poor superconducting properties and hence cannot be practically used.

Still further, the conventional processes cannot stably or reproducibly produce thin films of Bi-type oxide superconductors having uniform properties.

An object of the present invention is to solve the problems and to provide a process for preparing a single crystal thin film of Bi-type oxide superconductor whose c-axis is oriented in parallel with the surface of a substrate.

SUMMARY OF THE INVENTION

The present invention provides a process for preparing a single crystal thin film made of a superconductor oxide of Bi, Sr, Ca, and Cu on a substrate by a sputtering method by using a target made of a sintered oxide of Bi, Sr, Ca, and Cu, and with its c-axis oriented in parallel with the surface of the substrate, characterized in that the sputtering is effected under such a condition that the surface of the substrate makes a non-zero angle with respect to the surface of the target and employing a substrate temperature between 500° C. and 750° C. and a gas pressure between 0.001 Torr and 10 Torr.

The essence of the present invention resides in that a single crystal thin film of oxide superconductor of the Bi-Sr-Ca-Cu-O system, whose c-axis is oriented in parallel with the surface of substrate, is prepared by a so-called "off-axis sputtering" method at a substrate temperature between 500° C. and 750° C. at a gas pressure between 0.0001 Torr and 10 Torr.

The angle made by the two surfaces is preferably 90°.

According to the process of the present invention, a number of single crystal thin films, each made of a different single phase, can be prepared by properly selecting the target composition. The single crystal thin film according to the present invention preferably has a composition selected from a group consisting of $Bi_2Sr_2Ca_2Cu_3O_x$ and $Bi_2Sr_2Ca_1Cu_2O_x$.

The sputtering is preferably effected by magnetron sputtering, in which high-frequency power between 10W and 1,000W is applied to a cathode. The sputtering is preferably effected in the presence of a mixed gas or argon and oxygen at a gas pressure between 0.001 and 10 Torr with an oxygen volume ratio of $O_2/(Ar+O_2)$ which is more than 0.05. The deposition rate is preferably selected between 0.1 and 100Å/sec. The thin film can have a thickness of at least 50Å.

The single crystal thin film of Bi-Sr-Ca-Cu-O oxide obtained by the present invention has a c-axis which is oriented in parallel with the surface of the substrate. In other words, the critical current which flows along a depth-wise direction of the thin film is greater than that along a direction which is parallel with the surface of substrate, so that the thin film prepared by the process according to the present invention is advantageously used in the fabrication of multi-layered superconducting devices in which additional layer(s) will be deposited thereon.

The process of the present invention permits obtainment of a single crystal thin film of oxide superconductor of a Bi-Sr-Ca-Cu-0 system having an improved quality over prior art thin films, without increasing the manufacturing cost, because the process according to the present invention can be carried out simply by selecting optimum operational conditions.

The process according to the present invention is expected to promote actual application of oxide superconductors in the field of electronic devices.

Now, the present invention will be described with reference to the drawing.

DESCRIPTION OF THE PREFERRED EMBODIMENTS

Figure 1:
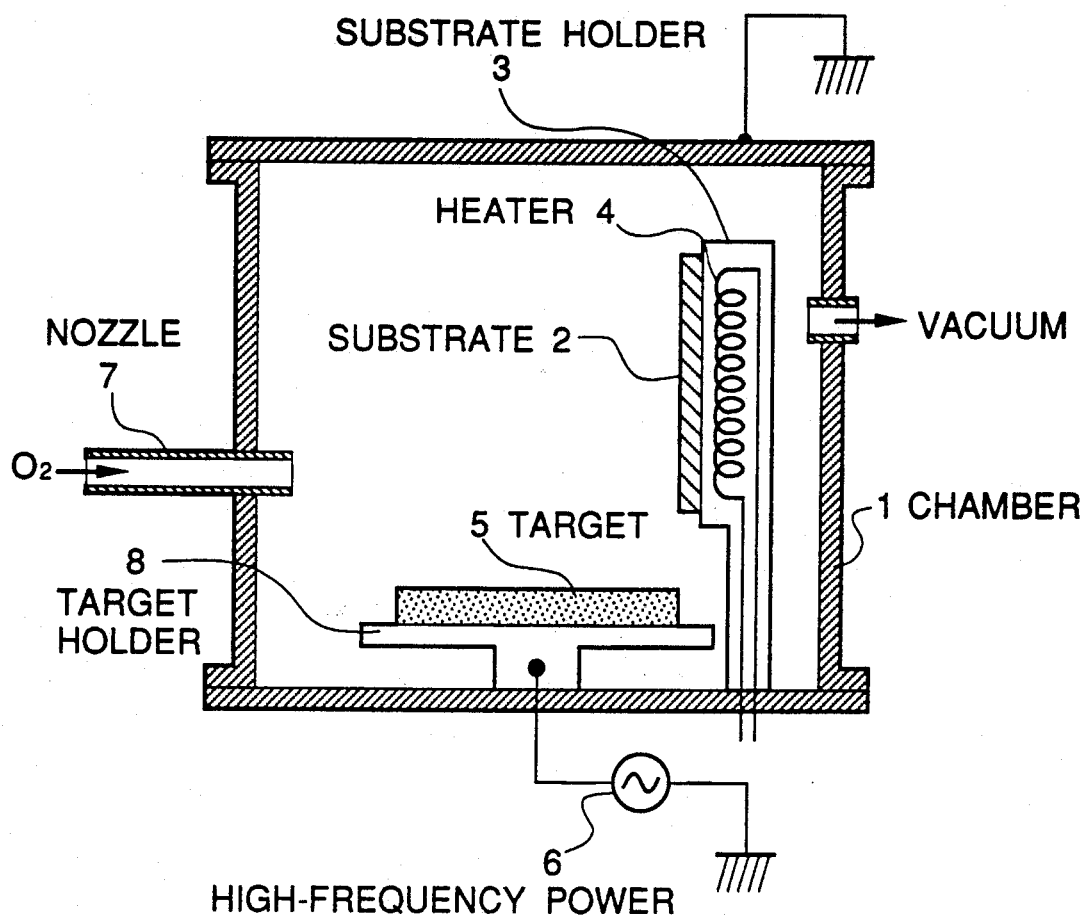
FIG. 1 is an illustrative cross sectional view of an apparatus which can be used for carrying out the process according to the present invention.

The apparatus shown in FIG. 1 has a vacuum chamber 1 having a gas inlet 7. In the vacuum chamber 1, there are a substrate holder 3 for securing a substrate 2 thereto and a target holder 8 for securing a target 5 thereto. A heater 4 is arranged inside the substrate holder 3.

According to the present invention, the substrate holder 3 is secured above the target 5 at a position such that a surface of the substrate 2 makes an angle of 90° relative to a surface of the target 5 at an edge of the target 5.

High-frequency power is applied to the target holder 8 from a high-frequency source 6 arranged outside the chamber 1.

The present invention will also be described with reference to Examples, but the scope of the invention is not to be limited thereto.

EXAMPLE 1

A thin film of oxide superconductor of the composition $Bi_2Sr_2Ca_1Cu_2O_x$ was prepared using the apparatus of FIG. 1.

A (100) MgO substrate was used as the substrate 2. As the target 5, a sintered oxide of Bi, Sr, Ca and Cu having atomic ratios of Bi:Sr:Ca:Cu = 1.8 :2 :1 : 1.8 was used.

In operation, a sputtering gas consisting of a mixture of Ar and $O_2$ was introduced into the chamber 1 at a gas pressure of 0.05 Torr with a partial pressure ratio of Ar : $O_2$ = 4 : 1. The substrate 2 was heated to 570° C. by the heater 4. High-frequency power was applied to the target holder. A thin film was grown on the substrate 2 to a thickness of 6,000Å at a deposition rate of 0.8 Å/sec.

The crystal structure of the resulting thin film was evaluated by scanning electron microscopy (SEM) and a reflective high-energy electron diffraction analyzer (RHEED) and the critical temperature was determined by measuring the electric resistance by the usual four probe method.

The results revealed that the resulting thin film was a thin film of a single crystal composed of $Bi_2Sr_2Ca_1Cu_2O_x$ whose c-axis was oriented in parallel with the surface of the substrate and which had a smooth surface of high quality. The critical temperature was 70° K.

EXAMPLE 2

Example 1 was repeated using the same apparatus as Example 1 but the target composition was modified in order to prepare a thin film of oxide superconductor of the composition $Bi_2Sr_2Ca_2Cu_3O_x$.

In this Example 2, the target 5 was changed to a sintered oxide of Bi, Sr, Ca, and Cu having atomic ratios of Bi:Sr:Ca:Cu = 1.9 : 2 : 2 : 2.3. The other operational conditions were the same as in Example 1.

The crystal structure of the resulting thin film was evaluated and the critical temperature was determined by the same method as in Example 1.

The results revealed that the resulting thin film is a thin film of single crystal composed of $Bi_2Sr_2Ca_2Cu_3O_x$ whose c-axis was oriented in parallel with the surface of the substrate and which had a smooth surface of high quality. The critical temperature was 104° K.

The thin films obtained by Example 1 and 2 were improved in quality over those obtained by known processes.

We claim:

1. A process for preparing a single crystal thin film made of oxide superconductor of Bi, Sr, Ca, and Cu on a substrate by a sputtering method by using a target made of a sintered oxide of Bi, Sr, Ca, and Cu and the single crystal thin film having its c-axis oriented in parallel with the surface of said substrate, characterized in that said sputtering is effected under such conditions that said surface of said substrate makes a non-zero angle with respect to the surface of said target, employing a substrate temperature between 500° C. and 750° C., wherein said angle between said substrate surface and said target surface is 90°, wherein said sputtering is effected by magnetron sputtering at high-frequency power between 10W and 1,000W, and wherein said sputtering is effected in the presence of a mixed gas of argon and oxygen at a gas pressure between 0.001 Torr and 10 Torr with an oxygen volume ratio of $O_2(Ar+O_2)$ of more than 0.05.

2. The process set forth in claim 1, wherein said single crystal thin film has a composition selected from a group consisting of $Bi_2Sr_2Ca_2Cu_3O_x$ and $Bi_2Sr_2Ca_1Cu_2O_x$.

3. The process set forth in claim 1, wherein said sputtering is effected at a deposition rate between 0.1 and 100 Å/sec.

4. The process set forth in claim 1, wherein said thin film has a thickness of at least 50Å.

* * * * *

UNITED STATES PATENT AND TRADEMARK OFFICE
CERTIFICATE OF CORRECTION

PATENT NO. : 5,244,873

DATED : September 14, 1993

INVENTOR(S) : HATTORI, et al

It is certified that error appears in the above-identified patent and that said Letters Patent is hereby corrected as shown below:

Col. 4, lines 39 and 40 (Claim 1, line 17) "$O_2(Ar+O_2)$" should be -- $O_2/(Ar+O_2)$ --.

Signed and Sealed this

Twenty-fourth Day of May, 1994

*Attest:*

BRUCE LEHMAN

*Attesting Officer*  *Commissioner of Patents and Trademarks*